219-121

CROSS REFERENCE SEARCH ROOM

INVENTORS.
DAVID B. MEDVED
LOUIS A. GARASI
By
Miketta, Glenny, Poms & Smith
ATTORNEYS.

United States Patent Office 3,445,926

Patented May 27, 1969

3,445,926

PRODUCTION OF SEMICONDUCTOR DEVICES BY USE OF ION BEAM IMPLANTATION

David B. Medved, Los Angeles, and Louis A. Garasi, North Hollywood, Calif., assignors to Electro-Optical Systems, Inc., Pasadena, Calif., a corporation of California Filed Feb. 28, 1967, Ser. No. 619,461
Int. Cl. H01l *7/54;* B23k *9/00*
U.S. Cl. 29—578 8 Claims

ABSTRACT OF THE DISCLOSURE

An exemplary method for producing a semiconductor component or device by the use of ion beam implantation. The surface of a silicon substrate is provided with a temporary chemically-removable layer. An ion beam is directed against a selected surface area of the layer to generally simultaneously and automatically (1) type-convert by ion implantation a region of the substrate below the area and (2) sputter away a portion of the layer to provide a contact-forming cavity above the converted region. An electrically-conductive chemically-resistant film is applied to the entire pretreated surface, with a contact portion of the film occupying the cavity, an intermediate portion of the film overlying the removable layer surrounding the cavity, and a thin annular portion of the film interconnecting the other portions. The removable layer is then removed as with a suitable etchant solution, and the intermediate and connecting film portions are removed to leave a diode device having an accurately positioned contact.

*Background of invention*

The older and more established diffusion techniques of microelectronics, i.e., production of tiny complete integrated electronic circuits on wafers or disks of material such as silicon and the like, depended heavily upon the use of masks. In accordance generally with the diffusion method, the type-convertible semiconductor material had to be first masked to define the selected regions to be doped and thus type-converted. This masking could be done by applying an oxide masking layer to the semiconductor material, overlaying the masking layer with a specially prepared negative, and exposing the negative to special light which causes a chemical reaction fixing exposed portions of the masking layer. The portions of the masking layer not so fixed could then be chemically removed to leave the desired mask. The masked semiconductor material could then be exposed to a high temperature atmosphere containing the selected dopants or impurities in a gaseous state. The dopants were thereby diffused into the semiconductor material at the places where it was exposed to the atmosphere by the mask to type-convert the selected regions. Masking was also used to define the location of the electrical or ohmic contacts for the various regions of the semiconductor devices.

A more recent prior proposed development in the field of microelectronics was the use of an ion beam to achieve the doping and type-conversion of selected regions by the implantation of ions. In general, in such prior development a wafer of silicon or the like was bombarded by accelerated ions such as potassium, phosphorus, boron or cesium to implant the ions in the selected regions of the silicon to produce various semiconductor components or devices. The ions were directed by an electron gun toward a target wafer, with the path of the beam being selectively controlled by suitable deflection means. The use of an ion beam provided a number of advantages over the diffusion method. For example, the ion beam operated effectively with a lower temperature atmosphere, and provided better control of the depth of penetration and the concentration gradient of the dopant. Further, it was possible to position components or devices in integrated circuits more compactly or in closer proximity to one another through the use of the ion beam.

However, in dealing with very small and closely arranged components, proper registry or alignment of ohmic contacts with the tiny component regions was often critical, so that even one slight inaccuracy in such registry could render the component or the entire integrated circuit defective. While the position of the ion beam could, as noted above, be closely controlled, when the beam was moved to a number of different positions to produce multiple components, there was opportunity for slight variation in relative positioning of the ion implanted regions. Further, when the ohmic contacts were applied in a subsequent operation to the ion beam implantation, the precise registry between implanted regions and their respective ohmic contacts might not be achieved. In addition, the precise positioning of the ohmic contacts on the ion beam implanted regions generally utilized high-precision masking techniques, adding considerably to the complexity and cost of the process.

The illustrated exemplary form of the present invention contemplates using an ion beam in a single position to generally simultaneously and automatically form both (1) an ion implanted region and (2) means locating the ohmic contact for the region in precise registry with the region. Thus, no masking is required for producing the contact and the accurate, precise positioning of the contact is assured.

*Summary of the invention*

The present invention relates generally to a method for the production of a semiconductor component or device by the use of ion beam implantation. It relates more particularly to the use of an ion beam to generally simultaneously both (1) type-convert a region and (2) locate the position of an electrical contact in engagement and accurate registry with that converted region. The method is particularly suitable for fabrication of high density semiconductor arrays, and it eliminates the need for masking such arrays to locate and provide the electrical contacts for the semiconductor components. The method also protects against shorting between the converted region and the adjacent regions of the semiconductor by the electrical contact.

Accordingly, it is an object of the present invention to provide a novel and improved method for ion beam formation of a semiconductor component or device.

Other objects and advantages of the present invention will become more apparent from the following description and the associated drawings.

*Description of the preferred embodiment*

Figure 1:
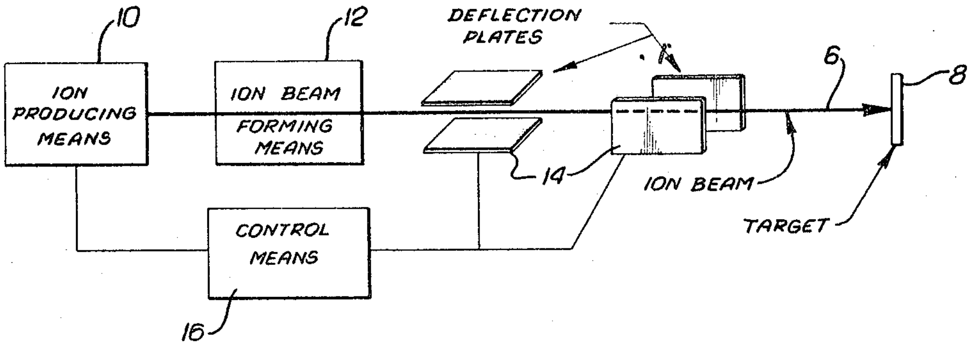
FIGURE 1 is a diagrammatic representation of a system utilized in the practice of this invention for directing a controlled ion beam against a semiconductor wafer.

Systems such as shown in FIG. 1, for delivering a controlled ion beam 6 to a semiconductor wafer 8, are known generally in the art. The illustrated system includes an ion-producing means 10 which may generate ions by a surface ionization process. It also includes ion beam forming means 12 for extracting the ions from the producing means 10 and accelerating and directing the ions toward the wafer by applying suitable voltages to the gun electrode. Deflection plates 14 operate to vary the path of the beam to control the position of the beam spot impinged on the target wafer. Such an exemplary system may operate for example in a vacuum of between $5\times10^{-6}$ and $1\times10^{-5}$ torr, and at an elevated target temperature of about 300 to 350° C. The current density may be about 15 ma./cm.$^2$, and the operating voltage may be about 8 kev. or as low as 5 kev. The beam spot size at the target may be controlled by the optical means and may be as small as 0.5 to 0.1 mil in diameter. The illustrated system may provide an ion beam of $K^+$ (potassium), although other ions such as cesium may selectively be used.

The illustrated semiconductor target wafer 8 is a p-type silicon, although, as with the ion beam, other materials may selectively be used, as for example gallium arsenside. The illustrated method appears selectively applicable to various other dopant ion beams and targets of Groups IV, III–V and II–VI semiconductors.

The production of a portion of a high-density diode array with electrical or ohmic contacts is illustrated in FIG. 2. Very briefly, the ion beam 6 is controlled as by means 16 to successively dope, by ion implantation, discrete, closely-arranged regions 24 of a semiconductor substrate or base portion 20 such as the silicon wafer 8. This effects type-conversion of each region 24 and junction formation between the converted region and adjacent regions of the base portion 20 to form a diode device. At the same time that the ion beam type-converts a region 24, it also, generally simultaneously and without being moved, produces a cavity 26 aligned with the converted region for the subsequent formation of an electrical contact 30 in accurate registry or alignment with the converted region.

Figure 2A:
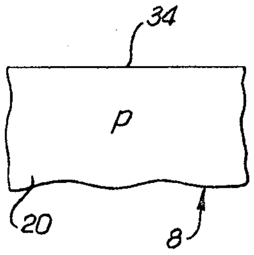
FIGURES 2(*a*) through 2(*g*) are diagrammatic representations of various steps in the production of a diode array, illustrating an exemplary embodiment of the present invention.
Figure 2B:
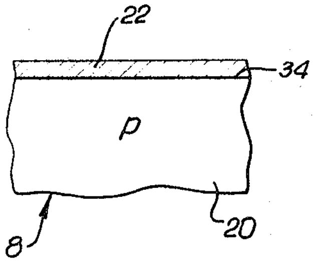
Figure 2C:
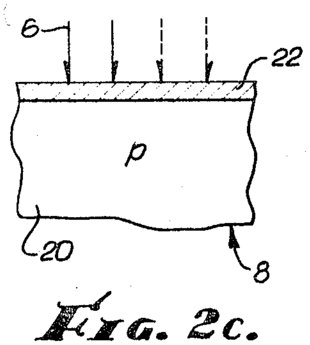
Figure 2D:
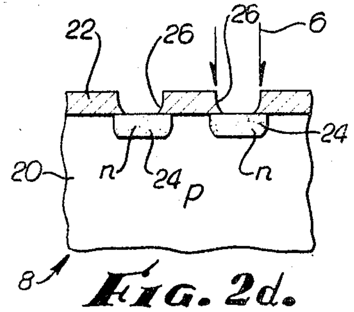
Figure 2E:
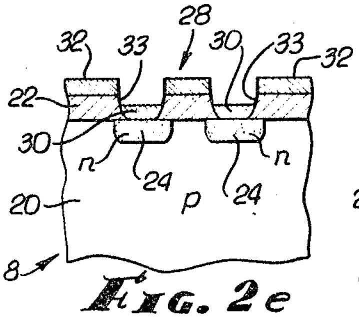
Figure 2F:
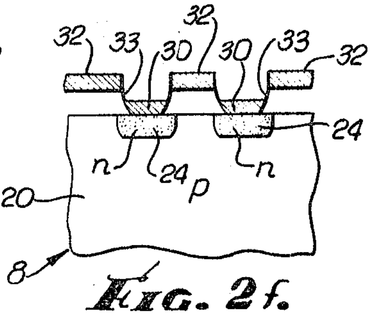
Figure 2G:
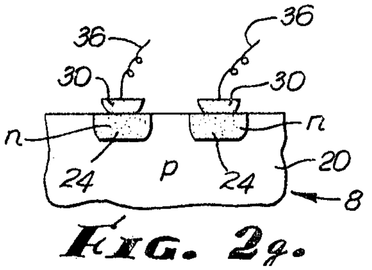

The individual steps of the exemplary method for such production will be recited summarily to facilitate understanding of the method, and will then be considered in detail. Initially, a surface 34 of the silicon wafer substrate or base portion 20 (FIG. 2*a*) is provided with a temporary layer 22 of a chemically removable material (FIG. 2*b*). The ion beam 6 is successively directed against selected surface areas of the layer 22 (FIG. 2*c*). At each area, the ion beam type-converts, by ion implantation, regions 24 of the base portion 20 below the area, and also sputters away (i.e., evapoartes) the layer 22 above the type-converted region 24 (FIG. 2*d*). One of the contact-forming cavities 26 is thereby produced in the removable layer 22 overlying each converted region 24. An electrically conductive film 28 is then deposited over the pretreated surfaces (FIG. 2*e*). In particular, contact portions 30 of the conductive film 28 occupy the cavities 26, while intermediate portions 32 cover the removable layer 22 surrounding the cavities; the contact portions 30 and the intermediate portions 32 are interconnected by thin annular portions 33. The removable layer 22 is then removed as by a suitable etchant solution which does not impair the conductive film or the semiconductor component itself (FIG. 2*f*). The intermediate and connecting portions 32, 33 of the conductive film are left unsupported and are easily removed, leaving the contact portions 30. A portion of the resultant completed semiconductor diode array is shown in FIG. 2*g*.

FIGURE 2(*a*) shows the substrate or base portion 20 of the wafer 8 from which the components or devices will be formed. The base portion 20 may be a part of a larger wafer or disk of such material or may constitute a bathtub or island of such p-type material in a wafer of different material. The base portion 20 is shown disposed with its target surface 34 generally horizontal and facing upwardly, and it will be described in this orientation as a matter of convenience. It will be understood however that it may be supported in other selected orientations such as the vertical orientation shown in FIG. 1. Further, the configurations in FIG. 2 have been enlarged in the vertical dimension and exaggerated for purposes of illustration.

As shown in FIG. 2(*b*), the removable layer 22 is formed or provided on the target surface 34 of the base portion 20. This may be accomplished by a suitable method such as by evaporation. This may be done prior to mounting the base portion in the vacuum system or after the base portion has been mounted in place. Since, as is noted generally above, the removable layer 22 is subsequently chemically removed by the etchant solution while the conductive layer and the semiconductor devices themselves should not be impaired by that solution, the material used for the removable layer may selectively be one suitable for such differential chemical reaction. By way of example, the surface 34 may be coated with a generally uniform and relatively thick layer of copper which may be several hunderd angstroms thick.

The next step in the method, which is shown in successive stages in FIGURES 2(*c*) and 2(*d*), is the exposing of the upper surface of the removable layer 22 to the ion beam 6. The ion beam 6 electro-machines or sputters away the removable layer 22 over predetermined or selected surface areas and also implants ions in the regions 24 of the base portion 20 generally aligned with the respective areas. This effects doping of each region 24 and its type-conversion, in the illustrated example, from p-type silicon to n-type silicon. The n-type material is separated from the p-type material by an n-p junction, with the resultant configuration providing a diode device. FIGURE 2(*c*) illustrates the successive formation of a pair of these diode devices by moving the single ion beam 6 first to the position shown in solid line in FIGURE 2(*c*) and then to the position shown in broken line in that figure. The beam 6 may be sequentially directed to and maintained in each of these positions for a sufficient time to sputter away a portion of the removable layer 22 and to produce the desired type-conversion as shown in FIGURE 2(*d*). The illustrated beam 6 may produce a spot at target which is generally circular. Typical exposure times at each position may be on the order of several hundred seconds for beam current densities in the order of 100 micro amp/cm.$^2$.

A plurality of individual components or devices may be formed on a single target wafer with the wafer being subsequently broken into small parts or chips each comprising a device. Alternately, the components or devices may provide portions of a diode array or passive components in integrated circuits. The particular configuration, arrangement, spacing and the like of the components or devices formed may be selectively varied as required. Further, the characteristics of the individual components or devices may be selectively varied. For example, the ion beam may be focused to a desired spot size to produce a desired size component. The depth of penetration and concentration of the ion implanted dopant may be affected by controlling certain variables such as beam energy, velocity, target temperature, crystallographic orientation of the target wafer, and current density. The spot size at target may be as small as 0.5 to 0.1 mil in diameter. As another example, a 5 mil in diameter spot produces a diode of about 6 mil in diameter. The junction depth or depth of penetration may, for example, be from 0.1 to 1 micron, or even greater for increased ion beam energy.

The use of the ion beam permits very close spacing or packing between components or devices of an integrated circuit so that the circuit can react quickly and is very compact.

The movement of the beam may be programmed and automated for high-production runs. Further, instead of utilizing a single ion beam, two or more such beams may be used simultaneously for the same target.

The sputtering away of portions of the removable layer 22 involves the vaporization of that material by bombardment by the ions rather than by heat.

The illustrated method operates to prevent the contacts 30 formed for the converted regions 24 from shorting the semiconductor devices by providing a path from a region 24 to an adjacent region of the substrate. In particular, it is important that, at the surface 34 of the substrate, the implanted region 24 extend outwardly from or surround the electrical contact for the region. This may be achieved by both the spreading of the ion implantation and by the character and duration of the electro-machining or sputtering away of the cavities 26 by the ion beam. Thus, the region which is ion implanted by the beam may be spread or extended outwardly transversely of the actual cross-section of the ion beam. While there is some inherent spreading of ion implantation from ion beams, the outward spreading of the converted regions 24 is affected and may be controlled by certain factors. In particular these factors include the target temperature, the crystallographic orientation of the target, the beam intensity (affecting the local temperature of the target), the beam energy, and the configuration and character of the removable layer. It appears that elevating the target temperature to the area of 400° C. produces a substantial increase in spreading of the converted region. Such spreading may be compensated for in the provision of a beam spot size which when spread will produce the desired size of type-converted region.

The aforementioned control of dimensions of the contact at the surface 34 of the substrate by controlling the sputtering away of the cavities 26, is facilitated by the tendency of the ion beam to remove material in a convex or crater-shaped cavity as shown in FIG. 2(*d*). By controlling the time of exposure to the ion beam, the cavities 26 may be formed with a reduced size opening at their lower ends where they meet with the substrate surface 34. This further tends to insure that the contacts will not extend outwardly far enough to form a connection to the substrate surface 34 surrounding the regions 24.

As noted above, the electro-machining or sputtering away of a portion of the removable layer 22 to form a cavity 26 and the ion implantation of the base portion 20 below the cavity are carried on generally simultaneously by the ion beam, with the beam being set in a single position. More specifically, it appears that when the ion beam is first directed against an area of the layer 22, some ions will penetrate the layer 22 and produce some immediate ion implantation of the region 24 toward which the ion beam is directed. Some of the ions will be diverted and/or used in the sputtering away of the layer material. Also, some of the ions which penetrate the layer will at least be slowed down to reduce the amount or depth of penetration into the region. As the thickness of the layer above that region is progressively reduced by the electro-machining action of the ion beam, it would be expected that fewer of the ions would be diverted or used before reaching the region and that the amount of slowing would also be reduced. Therefore, it appears that, in general, a greater amount of ion implantation and a greater depth of implantation will occur toward the end of the exposure period to the ion beam. Nevertheless, for practical purposes, the electro-machining and the ion implantation may be considered as taking place simultaneously or generally simultaneously.

The next step in the method is the application of the electrically conductive film 28 over all of the preworked surfaces as shown in FIG. 2(*e*).

The film 28 is substantially thinner than the layer 22 so that the film contact portions 30 in the cavities 26 occupy only the lower parts of the cavities, with the thin annular interconnecting film portions 33 disposed around the upper parts of the cavities. The intermediate film portions 32 overlie the layer 22 and are connected to the contact portions 30 only by the thin interconnecting portions 33.

The conductive film, which may be of suitable selected materials such as silver or gold, may be deposited to a desired thickness by a suitable method such as by evaporation or sputtering. This may be done in situ or in a separate chamber to which the work is transported for that purpose. The bond of the contact portions 30 to the surface 34 should be sufficiently strong to withstand pull on the contact portions 30 when the other portions of the film 28 are removed and during use of the semiconductor component. In addition to being electrically conductive, the film should be resistant to the etchant solution. The illusrated film 28 is formed in such a manner that it is sufficiently porous to permit the etchant solution ready access to the underlying removable layer 22. The method or manner of so forming the film 28 so that it has substantial porosity may itself be a suitable method known in the art.

The next step in the process is the removal of the removable layer 22 as by placing the components in the etchant solution, which may be, for example, $FeCl_3$. The solution will remove the removable layer without any significant damage or other adverse affect to the film 28 or the semi-conductor material. (FIG. 2*f*).

After the removable layer 22 has been removed, the intermediate and interconnecting portions 32, 33 of the conductive film 28 may be readily removed as by breaking the film at the thin interconnecting portions 33. Suitable electrical wires or leads 36 of gold or the like may be attached as by soldering to the contacts 30 (FIG. 2*g*). The configuration may then be broken into individual components or diode devices or may be broken into integrated circuits.

The various materials as well as the finished components or devices and/or circuits may be subjected to various other treatments or operations before or after or variously integrated with the steps of the present invention. The finished product may then be sealed or packaged as in vacuum-type containers for subsequent use.

As noted generally above, the illustrated method will have application to the production of various other types and forms of electrical components, elements or devices and circuits as for example transistors, triodes, solar cells, resistors and such semi-conductor devices.

Thus, the illustrated method contemplates the use of an ion beam for producing semi-conductor components or devices without the use of masks for defining either: regions for the type conversion; or associated electrical contacts for the regions. The method provides a relatively simple, economical way to implant dopant or impurities in a region of a target wafer to convert its type while generally simultaneously and automatically forming a contact cavity that defines the position of the contact for that converted region in accurate registry with the region. The method is readily adaptable to programmed operation and for the fabrication of high density arrays. Further, by producing each converted region so that it extends outwardly on all sides of the cavity for defining the dimensions of the associated contact, the diode device is protected against the contact being formed so that it shorts across the n-p junction of the device.

Various modifications and changes may be made in the exemplary form of the invention as described and illustrated herein without departing from the spirit and scope of the invention.

Various features of the invention are set forth in the following claims.

We claim:

1. A method of producing a semi-conductor device by ion beam implantation, said method comprising:

(a) applying a layer to the surface of a portion of convertible semi-conductor material, the layer being removable by at least one predetermined chemical solution;

(b) directing an ion beam against the removable layer over a discrete surface area thereof to generally simultaneously effect (1) removal of the layer over that area so as to expose a section of the surface of the semi-conductor portion, and (2) type-conversion, by ion implantation, of a region of the semi-conductor portion generally aligned with the discrete area;

(c) applying an electrically conductive film over the removable layer and the exposed section of the surface of the semi-conductor portion, the film being non-removable by the predetermined chemical solution;

(d) removing the layer by use of the predetermined chemical solution; and (e) removing portions of the film which had overlaid the removable layer, while leaving the portion of the film which overlies the type-converted region and which provides an electrical contact therefor.

2. A method as defined in claim 1, wherein the step of directing the ion beam comprises directing it sequentially against more than one discrete area of the removable layer.

3. A method as defined in claim 2, including the further step of automatically controlling (1) the movement of the ion beam between the areas, and (2) the duration and character of the beam at each area.

4. A method as defined in claim 1, including the further step of forming the electrically conductive film so that it has substantial porosity, to facilitate the removal of the layer.

5. A method as defined in claim 1, comprising the further step of regulating the ion beam to cause ion implantation to occur in a region which, at the surface of the semi-conductor portion, extends transversely outwardly at all sides from the exposed section of that surface.

6. A method as defined in claim 5, wherein the step of regulating includes providing a layer temperature of more than about 375° C.

7. A method of producing a semi-conductor device by ion beam implantation, said method comprising:

(a) applying a layer of copper to the surface of a portion of convertible semi-conductor material;

(b) directing an ion beam in a single fixed path against a discrete surface area of the layer to generally simultaneously and automatically effect (1) removal of the layer over that area so as to expose a section of the surface of the semi-conductor portion and (2) type-conversion, by ion implantation, of a region of the semi-conductor portion generally aligned with the discrete area;

(c) applying a film of silver over the removable layer and the exposed section of the surface of the semi-conductor portion;

(d) removing the layer of copper by use of an $FeCl_3$ solution; and (e) removing portions of the silver film which had overlaid the removable layer, while leaving the portion of the film which overlies the type converted region and which provides a silver contact therefor.

8. A method of producing a silicon semi-conductor device by ion beam implantation, said method comprising:

(a) applying a layer to the surface of a portion of p-type silicon, the layer being removable by at least one predetermined chemical solution;

(b) directing an ion beam of a group including cesium and potassium against the removable layer over a discrete surface area thereof to generally simultaneously effect, (1) type-conversion, by ion implantation, of a region of the p-type silicon generally aligned with the discrete area to n-type silicon, and (2) removal of the layer over the area so as to expose a section of the surface of n-type silicon;

(c) applying an electrically conductive film over the removable layer and the exposed section of the surface of the n-type silicon, the film being non-removable by the predetermined chemical solution;

(d) removing the layer by use of the predetermined chemical solution; and (e) removing portions of the film which had overlaid the removable layer, while leaving the portion of the film which overlies the n-type silicon and which provides an electrical contact therefor.

References Cited

UNITED STATES PATENTS

| | | | |
|---|---|---|---|
| 3,080,481 | 3/1963 | Robinson | 29—584 X |
| 3,098,954 | 7/1963 | Misra | 317—234 |

WILLIAM I. BROOKS, *Primary Examiner.*

U.S. Cl. X.R.

29—590; 148—1.5; 219—121